(12) United States Patent
Van Der Velden

(10) Patent No.: US 8,035,353 B2
(45) Date of Patent: Oct. 11, 2011

(54) BATTERY RECHARGE PREVENTION PRINCIPLE FOR SHORT BATTERY VOLTAGE DIPS

(75) Inventor: Frank Van Der Velden, Berghem (NL)

(73) Assignee: ST-Ericsson SA, Geneva (CH)

(*) Notice: Subject to any disclaimer, the term of this patent is extended or adjusted under 35 U.S.C. 154(b) by 628 days.

(21) Appl. No.: 12/097,620

(22) PCT Filed: Dec. 7, 2006

(86) PCT No.: PCT/IB2006/054662
§ 371 (c)(1),
(2), (4) Date: Jun. 16, 2008

(87) PCT Pub. No.: WO2007/085915
PCT Pub. Date: Aug. 2, 2007

(65) Prior Publication Data
US 2008/0309292 A1 Dec. 18, 2008

(30) Foreign Application Priority Data
Dec. 15, 2005 (EP) .................................. 05112211

(51) Int. Cl.
*H02J 7/04* (2006.01)
(52) U.S. Cl. ........................................ 320/157; 320/162
(58) Field of Classification Search .................. 320/157, 320/162
See application file for complete search history.

(56) References Cited

U.S. PATENT DOCUMENTS

| | | | |
|---|---|---|---|
| 4,080,560 A * | 3/1978 | Abert | 324/429 |
| 5,396,163 A * | 3/1995 | Nor et al. | 320/159 |
| 5,955,869 A * | 9/1999 | Rathmann | 320/132 |
| 6,169,388 B1 * | 1/2001 | Niemitalo et al. | 320/139 |
| 6,373,790 B1 * | 4/2002 | Fujisawa | 368/204 |
| 7,573,240 B2 * | 8/2009 | Spiridon | 320/133 |
| 2006/0113963 A1 * | 6/2006 | Wang et al. | 320/145 |

FOREIGN PATENT DOCUMENTS

EP 0326184 A2 8/1989

(Continued)

*Primary Examiner* — M'Baye Diao

(57) ABSTRACT

The present invention relates to a method and circuit configuration (100) for preventing any needless battery recharge at each short battery voltage dip. Such a circuit configuration (100) comprises a detector means (200) for detecting a voltage variation ($\Delta V$) of a variable value ($V_{bat}$) across a battery (BAT) dropping below a threshold value ($V_{ref}$), followed by a time determination means (300) for measuring an elapsed time ($t_e$), as soon as the variable value ($V_{bat}$) decreases below the threshold value ($V_{ref}$), and evaluating a duration ($\delta$) of the voltage variation ($\Delta V$) relative to a reference time (W). The threshold value ($V_{ref}$) is defined as the value from which a battery charge cycle, initiated by a battery charge controller (400), is deemed to be necessary. No battery charge cycle will be restarted when the elapsed time ($t_e$) is less than the reference time (W), i.e., when the battery (BAT) is submitted to short voltage dips. On the contrary, a resume flag (RF) indicating that the elapsed time ($t_e$) has lasted longer than the reference time (W) will be set and sent to the battery charge controller (400) in order to initiate a new battery charge cycle. The time determination means (300) may be disabled as soon as the resume flag (RF) is reset, i.e., as soon as the variable value ($V_{bat}$) exceeds the threshold value ($V_{ref}$), or alternatively, as soon as the resume flag (RF) is set, while saving power dissipation. The invention can be applied to any portable and mobile device using a removable and rechargeable battery (BAT) and implemented in any power and battery management integrated circuit (IC).

18 Claims, 3 Drawing Sheets

FOREIGN PATENT DOCUMENTS

| | | |
|---|---|---|
| EP | 1257034 A2 | 11/2002 |
| JP | 09182283 A | 7/1997 |
| JP | 09261882 A | 10/1997 |
| WO | 9909635 A1 | 2/1999 |

* cited by examiner

BATTERY RECHARGE PREVENTION PRINCIPLE FOR SHORT BATTERY VOLTAGE DIPS

The present invention relates to a method and circuit configuration for preventing the battery charge controller from starting a charge cycle at each short battery voltage dip.

The disk drive is the most commonly used peripheral for relatively fast storage and retrieval of large amounts of data. Used originally for systems like desktop computers and servers, these drives, such as hard disk drive or optical disk drive, now form an integral part of many portable and mobile devices like portable jukeboxes, portable multimedia applications, cellular phones, digital enhanced cordless telecommunications (DECT) phones, personal digital assistants (PDA's), portable personal computers, camcorders, digital still cameras, and portable storage devices (e.g. USB (Universal Serial Bus) memory stick using a hard disk). Each of them can operate in a charge-and-play mode wherein an external DC power source simultaneously supplies their removable battery and associated circuitry.

In today's audio-video applications, while playing music files or watching a video file from a hard disk or optical disk, the disk drive has to spin at periodic intervals in order to save power while intermittently re-filling the data buffer with which it communicates.

This periodic sequence of buffer fill/empty cycles depends on the type of data compression which is used for the data in the file, the data streaming bit rate of the outgoing channel, the data buffer size and the FIFO (first-in first-out) handling of the data buffer.

The duration of reading the hard disk or optical disk while filling the data buffer depends on the read access of the disk, the write access of the data buffer, the transfer rate of the data bus between the hard disk or optical disk and the data buffer.

During reading of the hard disk or optical disk, the load on the supply of the hard disk drive or optical disk drive can vary to a large extent, such that these load variations can cause voltage dips in the battery voltage.

Most Li-ion battery chargers restart the battery charging process when the battery voltage drops below a certain threshold voltage. In most cases, this threshold (also called resume level) is either fixed (e.g. at 96% of the maximum battery voltage) or programmable.

Therefore, the battery voltage drop caused by activating a hard disk drive or optical disk drive while being connected to a charge supply, can lead to an unnecessary restart of the battery charging process, followed, in most implementations, by a new unnecessary battery full interrupt.

It is therefore an object of the present invention to provide a circuit configuration capable to prevent a battery charge controller which controls the battery charge cycle from starting a needless charge cycle at each short battery voltage dip, as well as a corresponding prevention method.

The invention is defined by the independent claims, the dependent claims describing advantageous embodiments. Accordingly, a circuit configuration comprises a detector means for detecting a voltage variation of a variable value dropping below a threshold value, fixed or programmable, and a time determination means, located behind the detector means, for measuring an elapsed time as soon as the variable value decreases below the threshold value. Thereby, the duration of such a voltage variation relative to a reference time, fixed or programmable, can be evaluated and allow to make a distinction between short and long voltage dips.

Furthermore, in case of long voltage dips, i.e., as soon as the elapsed time reaches the reference time, a resume flag is set. Thus, information indicating that the voltage variation has lasted longer than the reference time can be stored.

Moreover, the variable value may be the voltage across a battery and in this case, the resume flag can be sent to the battery charge controller which controls the charge cycle of the battery submitted to these voltage variations. When received, the battery charge controller is instructed that the battery undergoes long voltage variations and that it is hence allowed to start a battery charge cycle. On the contrary, without such an instruction, no charge cycle will be initiated when the battery is submitted to short voltage dips. By thus reducing the total number of charge cycles, the number of interrupts generated by the battery charger towards the central microcontroller will be also minimized resulting in an extension of the battery lifetime.

The detector means may be a comparator means for thus comparing the variable value with the threshold value and generating a resulting output state HIGH or LOW.

The time determination means may be a counting means for counting the elapsed time.

Additionally, the enabled time determination means may be disabled either as soon as the resume flag is reset or, alternatively, as soon as the resume flag is set. In the latter case, power dissipation can thereby be saved. The circuit configuration can be implemented in any power and battery management integrated circuit (IC) that controls the battery charge cycle.

The present invention will be now described based on preferred embodiments with reference to the accompanying drawings in which.

Figure 1:
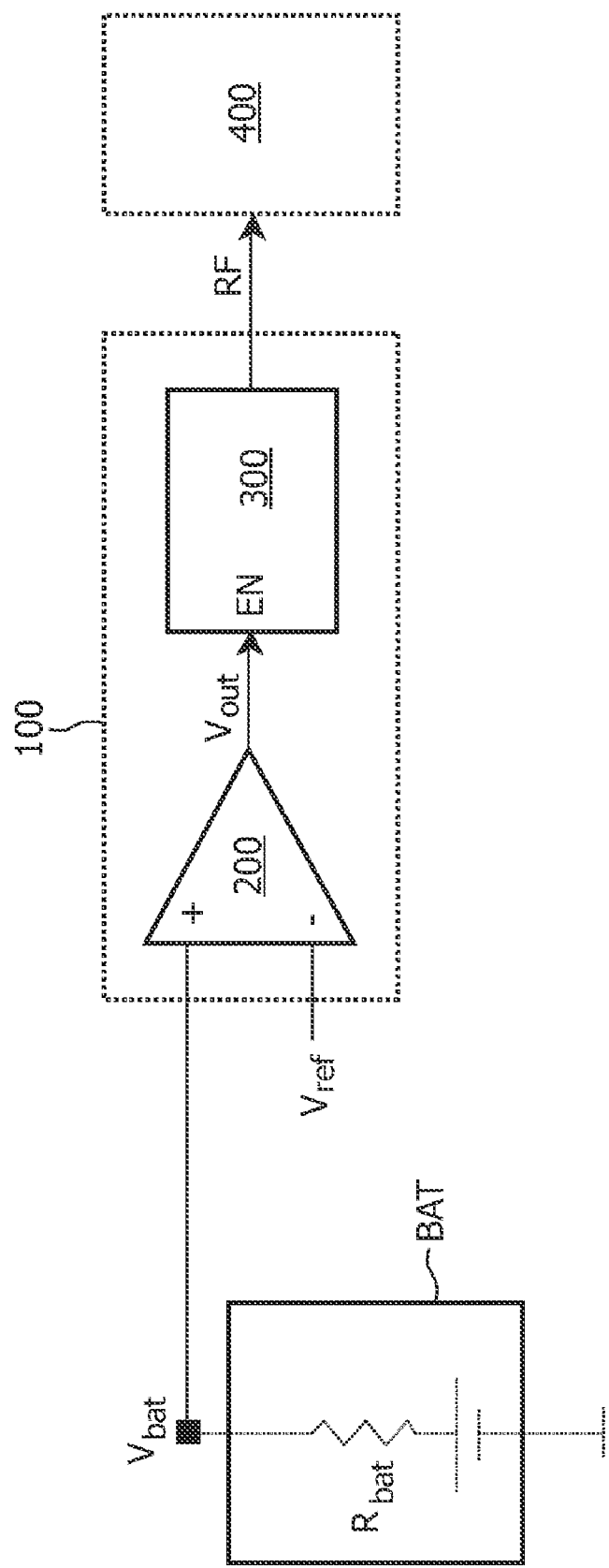
FIG. 1 shows a circuit configuration according to the preferred embodiment of the invention.

In FIG. 1, the circuit configuration 100 according to the preferred embodiment of the invention includes a time determination means 300, such as a counter or a de-bounce circuit, located behind a detector means 200, such as a comparator.

In order to detect a voltage variation $\Delta V$, a first input of the detector means 200 is connected to a terminal susceptible to be submitted to such voltage variations, whereas a second input is connected to a threshold voltage $V_{ref}$ defined as being the value, fixed or programmable at for example 96% of the maximum battery voltage, from which a battery recharge is deemed to be necessary.

Starting from the example of a battery charger (not represented herein) operating in a charge and play mode wherein any portable and mobile device can have its removable battery BAT and associated circuitry simultaneously supplied by an external DC power source, the first input may be linked to the terminal to which the battery BAT is connected. Whenever the circuitry requires an extra current from the battery BAT, for example when the hard disk drive or optical disk drive has to intermittently spin for re-filling the data buffer with which it communicates, the amplitude of the current may be such that its product with the battery source impedance $R_{bat}$ is a significant portion of the battery voltage potential $V_{bat}$, resulting in a substantial battery voltage dip.

Figure 2:
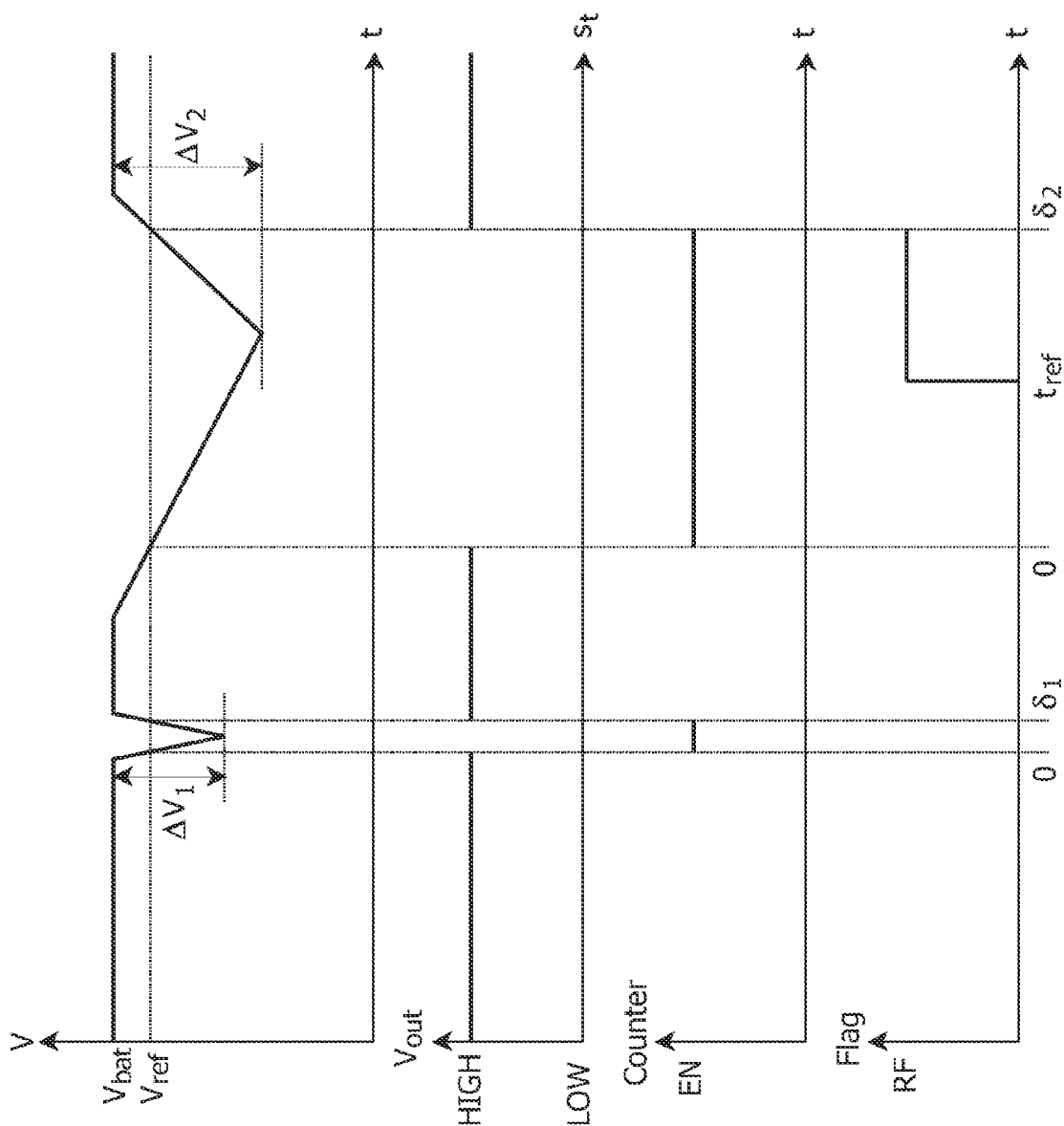
FIG. 2 shows the plots versus time of the battery voltage $V_{bat}$ submitted to different voltage dips, the voltage level $V_{out}$ at the output of the comparator, the status (enabled-disabled) of the counter and the status (set-reset) of the resume flag, in case the counter is disabled as soon as the resume flag is reset.

As illustrated in FIG. 2, the detector means 200 compares both inputs and generates an output signal $V_{out}$ having a first state LOW when the threshold voltage $V_{ref}$ is greater than the battery voltage $V_{bat}$, and a second state HIGH when the threshold voltage $V_{ref}$ is less than the battery voltage $V_{bat}$.

The resulting output signal $V_{out}$ is then transmitted to an edge-triggered input of the time determination means 300, e.g. the enable input EN, such that the time determination means 300 is enabled by a first transition (falling edge) of the output signal $V_{out}$ from the second state HIGH to the first state LOW, and disabled by a second transition (rising edge) of the output signal $V_{out}$ from the first state LOW to the second state HIGH.

The time determination means 300 initiates a measurement of an elapsed time $t_e$ as soon as the battery voltage $V_{bat}$ reaches the threshold voltage $V_{ref}$, in order to evaluate a duration $\delta$ (refer to $\delta_1$ and $\delta_2$) of the voltage variation $\Delta V$ (refer to $\Delta V_1$ and $\Delta V_2$) corresponding to the time interval during which the battery voltage $V_{bat}$ is below the threshold voltage $V_{ref}$.

Whenever the elapsed time $t_e$ reaches a reference time $t_{ref}$ (e.g. a de-bounce time), fixed or programmed, a resume flag RF is set while being in a high-state and sent to the battery charge controller for giving indication that the voltage variation $\Delta V$ (refer to $\Delta V_2$) has lasted longer than the reference time $t_{ref}$. The resume flag RF will remain in the high-state until the battery voltage $V_{bat}$ exceeds the threshold voltage $V_{ref}$, i.e., until the output signal $V_{out}$ reverts to the second state HIGH. On the other hand, the resume flag RF will be reset when the output signal $V_{out}$ switches to the first state LOW.

Informed by the high-state resume flag, the battery charge controller will then initiate a charge cycle for re-charging the battery BAT when only submitted to long voltage dips (refer to $\Delta V_2$ and $\delta_2$). Needless battery recharge will be hence avoided when the battery BAT is only submitted to short voltage dips (refer to $\Delta V_1$ and $\delta_1$), i.e., when the resume flag is in a low-state because the elapsed time $t_e$ is below the reference time $t_{ref}$.

By thus reducing the total number of charge cycles, the battery lifetime will be extended and the number of interrupts generated by the battery charger towards the central microcontroller will be minimized.

Figure 3:
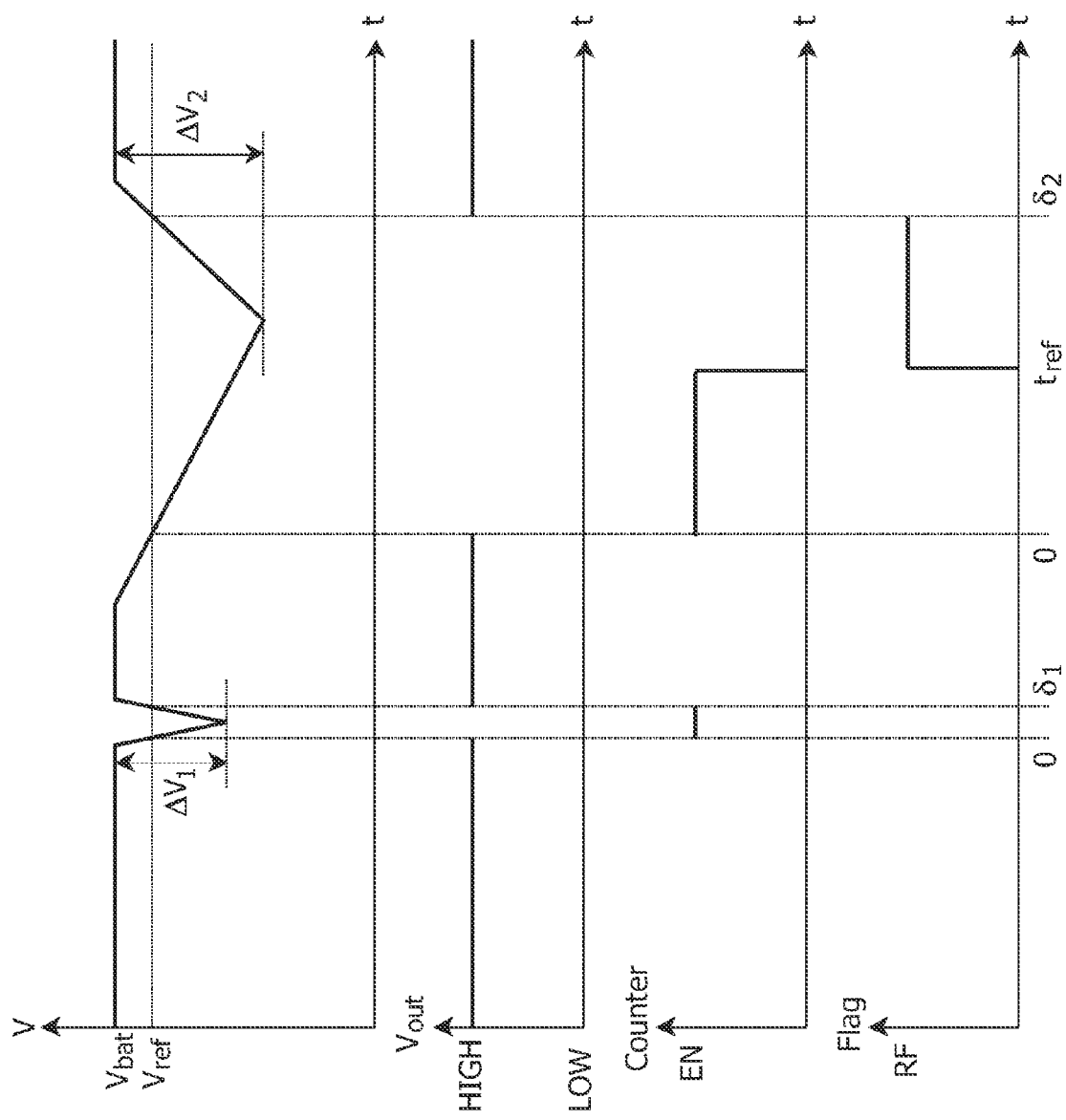
FIG. 3 shows the plots versus time of the battery voltage $V_{bat}$ submitted to different voltage dips, the voltage level $V_{out}$ at the output of the comparator, the status (enabled-disabled) of the counter and the status (set-reset) of the resume flag, in case the counter is disabled as soon as the resume flag is set.

As depicted in FIG. 3, the invention such as described can be alternatively used while disabling the time determination means 300 a soon as it has reached the reference time $t_{ref}$. Then, extra energy dissipated in the active time determination means 300 can be saved.

It is noted that the invention can be applied to any rechargeable battery, whether this battery is removable or not, and implemented in any power and battery management integrated circuit (IC) that controls the battery charge cycle.

In summary, a method and circuit configuration 100 for preventing any needless battery recharge at each short battery voltage dip has been described. Such a circuit configuration 100 comprises a detector means 200 for detecting a voltage variation $\Delta V$ of a variable value $V_{bat}$ across a battery BAT dropping below a threshold value $V_{ref}$, followed by a time determination means 300 for measuring an elapsed time $t_e$, as soon as the variable value $V_{bat}$ decreases below the threshold value $V_{ref}$, and evaluating a duration $\delta$ of the voltage variation $\Delta V$ relative to a reference time $t_{ref}$. The threshold value $V_{ref}$ is defined as the value from which a battery charge cycle, initiated by a battery charge controller 400, is deemed to be necessary. No battery charge cycle will be restarted when the elapsed time $t_e$ is less than the reference time $t_{ref}$, i.e., when the battery BAT is submitted to short voltage dips. On the contrary, a resume flag RF indicating that the elapsed time $t_e$ has lasted longer than the reference time $t_{ref}$ will be set and sent to the battery charge controller 400 in order to initiate a new battery charge cycle. The time determination means 300 may be disabled as soon as the resume flag RF is reset, i.e., as soon as the variable value $V_{bat}$ exceeds the threshold value $V_{ref}$, or alternatively, as soon as the resume flag RF is set, while saving power dissipation. The invention can be applied to any portable and mobile device using a removable and rechargeable battery BAT and implemented in any power and battery management integrated circuit (IC).

Finally but yet importantly, it is noted that the term "comprises" or "comprising" when used in the specification including the claims is intended to specify the presence of stated features, means, steps or components, but does not exclude the presence or addition of one or more other features, means, steps, components or group thereof. Further, the word "a" or "an" preceding an element in a claim does not exclude the presence of a plurality of such elements.

The invention claimed is:

1. A circuit configuration for preventing a battery recharge in response to short battery voltage dips, said circuit configuration comprising:
   a detector means for detecting a voltage variation of a variable value, said variable value dropping below a threshold value;
   a time determination means for initiating a measurement of an elapsed time as soon as said variable value reaches said threshold value, in order to evaluate a duration of said voltage variation, said duration corresponding to a time interval during which said variable value is below said threshold value, and said time determination means coupled to an output of said detector means;
   wherein a resume flag is only set whenever said elapsed time reaches a reference time, said resume flag indicating that said voltage variation has lasted longer than said reference time.

2. A circuit configuration according to claim 1, wherein said detector means comprises a comparator means.

3. A circuit configuration according to claim 2, wherein said comparator means compares said variable value with said threshold value and generates a resulting output signal having a first state when said threshold value is greater than said variable value and a second state when said threshold value is less than said variable value, said output signal being fed to an input of said time determination means.

4. A circuit configuration according to claim 3, wherein said time determination means comprises a time counting means.

5. A circuit configuration according to claim 3, wherein said time determination means is enabled by a first transition of said output signal from said second state to said first state, said output signal maintaining said first state during said duration.

6. A circuit configuration according to claim 5, wherein said enabled time determination means is disabled by a second transition of said output signal from said first state to said second state.

7. A circuit configuration according to claim 5, wherein said enabled time determination means is disabled as soon as said time determination means has reached said reference time.

8. A circuit configuration according to claim 6, wherein said resume flag is reset by a second transition of said output signal from said first state to said second state.

9. A circuit configuration according to claim 8, wherein said variable value corresponds to a voltage across a battery.

10. A circuit configuration according to claim 9, wherein said resume flag is sent to a battery charge controller which controls a charge cycle of said battery in order to initiate said charge cycle.

11. A circuit configuration according to claim 9, wherein each one of said threshold value and said reference time is a value fixed or programmable.

12. A circuit configuration according to claim 9, wherein said time counting means is a counter.

13. A power and battery management integrated circuit, said power and battery management IC comprising at least:
a circuit configuration as specified in claim 9.

14. A prevention method for preventing a battery recharge in response to short battery voltage dips, comprising at least the following steps:
detecting a voltage variation of a variable value which drops below a threshold value;
initiating a time measurement as soon as said variable value reaches said threshold value, for measuring an elapsed time and evaluating a duration of said voltage variation; and
setting a resume flag whenever said elapsed time reaches a reference time, said resume flag indicating that said voltage variation has lasted longer than said reference time.

15. A prevention method according to claim 14, wherein said method further comprises a step of interrupting said time measurement as soon as said variable value exceeds said threshold value.

16. A prevention method according to claim 14, wherein said method further comprises a step of interrupting said time measurement as soon as said resume flag is set.

17. A prevention method according to claim 15, wherein said variable value corresponds to a voltage across a battery.

18. A prevention method according to claim 17, wherein said method further comprises a step of sending said resume flag to a battery charge controller which controls a charge cycle of said battery.

\* \* \* \* \*